United States Patent
Altolaguirre et al.

(10) Patent No.: US 8,773,826 B2
(45) Date of Patent: Jul. 8, 2014

(54) POWER-RAIL ELECTRO-STATIC DISCHARGE (ESD) CLAMP CIRCUIT

(75) Inventors: Federico Agustin Altolaguirre, Hsinchu County (TW); Ming-Dou Ker, Hsinchu County (TW); Ryan Hsin-Chin Jiang, Taipei (TW)

(73) Assignee: Amazing Microelectronic Corp., New Taipei (TW)

( * ) Notice: Subject to any disclaimer, the term of this patent is extended or adjusted under 35 U.S.C. 154(b) by 93 days.

(21) Appl. No.: 13/598,194

(22) Filed: Aug. 29, 2012

(65) Prior Publication Data

US 2014/0063663 A1    Mar. 6, 2014

(51) Int. Cl.
  *H02H 9/00*  (2006.01)

(52) U.S. Cl.
  USPC ............. 361/56; 361/91.1; 361/111

(58) Field of Classification Search
  CPC ........... H02H 9/04; H02H 9/046; H02H 9/00; H02H 9/005; H02H 9/041; H01L 127/0248; H01L 127/085; H01L 27/0248; H01L 123/60
  See application file for complete search history.

(56) References Cited

U.S. PATENT DOCUMENTS 7,586,721 B2 * 9/2009 Wang et al. ............ 361/56
7,755,871 B2   7/2010 Ker et al.
2008/0123229 A1 * 5/2008 Choi ..................... 361/56
2008/0123230 A1 * 5/2008 Yun ....................... 361/56
2012/0120531 A1 * 5/2012 Abou-Khalil et al. ... 361/56

OTHER PUBLICATIONS

M.-D. Ker, "Whole-chip ESD protection design with efficient VDD-to-VSS ESD clamp circuits for submicron CMOS VLSI", IEEE Trans. On Electron Devices, vol. 46, No. 1, pp. 173-183, Jan. 1999.
M.-D. Ker et al, "Overview of On-Chip Electrostatic Discharge Protection Design with SCR-Based Devices in CMOS Integrated Circuits", IEEE Trans. On Device and Materials Reliability, vol. 5, No. 2, pp. 235-249, Jun. 2005.
ESD Association Standard Test Method ESDA/JEDEC JS-001-2010, "for Electrostatic Discharge Sensitivity Testing—Human Body Model (HBM)—Component Level", 2010, 36 pages.
ESD Association Standard Test Method ANSI/ESD S5.2-2009, "for Electrostatic Discharge Sensitivity Testing—Machine Model (MM)—Component Level", 2009, 25 pages.

* cited by examiner

*Primary Examiner* — Jared Fureman
*Assistant Examiner* — Terrence Willoughby
(74) *Attorney, Agent, or Firm* — Muncy, Geissler, Olds & Lowe, P.C.

(57) ABSTRACT

A power-rail ESD clamp circuit with a silicon controlled rectifier and a control module is provided. The silicon controlled rectifier is connected to a high voltage level and a low voltage level for bearing a current flow. The control module is connected to the silicon controlled rectifier in parallel, and includes a PMOS, a NMOS, at least one output diode, a resistor and a conducting string. The silicon controlled rectifier is a P+ or N+ triggered silicon controlled rectifier. By employing the novel power-rail ESD clamp circuit, it is extraordinarily advantageous of reducing both a standby leakage current and layout area while implementation.

12 Claims, 13 Drawing Sheets

POWER-RAIL ELECTRO-STATIC DISCHARGE (ESD) CLAMP CIRCUIT

BACKGROUND OF THE INVENTION

1. Field of the Invention

The present invention relates to an Electro-Static Discharge (ESD) clamp circuit.

2. Description of the Prior Art

With the advance of the IC industry, the CMOS technologies have been shrunk to the nanometer scale. Because of this, the gate oxide thickness has been scaled down to several nanometers. With such a thin oxide, the gate leakage issue becomes the dominant source of leakage in advanced CMOS technologies. FIG. 1 shows the gate leakage simulation for NMOS and PMOS transistor with size 1 μm/1 μm with 1V-bias and T=25° C. It can be seen in FIG. 1 how the gate leakage issue aggravates with each shrink (i.e. 90 nm, 65 nm to 45 nm) in the CMOS processes.

Since the gate leakage issue impacts drastically in the traditional power-rail ESD protection circuit, the big capacitor used for the RC ESD-transient detection becomes an important source of leakage. The traditional power-rail ESD protection circuit thus is limited thereto.

On the other hand, area reduction is also important for reducing manufacturing costs. The area used by the capacitor in the power-rail ESD protection circuit is usually very large, resulting in very high manufacturing cost. Therefore, besides the leakage current problems, the traditional power-rail ESD protection circuit further encounters the area costing problems.

As the traditional power-rail ESD clamp circuit is a key part of the whole-chip ESD protection, a very typical realization of the power-rail ESD clamp circuit is shown in FIG. 2, which uses a silicon controlled rectifier as the main ESD Clamp. The silicon controlled rectifier is a better choice than a MOSFET for the main clamp device. The RC delay formed by the transistor $M_{CAP}$ and the resistor R is used to detect the fast transient nature of the ESD stress. When an ESD is zapping at $V_{DD}$, the internal node $V_{RD}$ is initially 0V and starts to rise with the RC time constant. The voltage drop across the resistor R thus turns the MOSFET $M_p$ to trigger the silicon controlled rectifier and discharge the ESD current through a safe path. Nevertheless, under normal circuit operation, the gate leakage through the transistor $M_{CAP}$ (due to the gate leakage effect) causes a voltage drop across the resistor R, thus slightly turning the MOSFET $M_p$ on and adding a second leakage path which increments even more the total leakage current.

Another technique to reduce the leakage in the capacitor has been previously proposed. This circuit, shown in FIG. 3, uses a series of switches to drive the capacitor bottom node to $V_{DD}$ or $V_{SS}$. Under normal circuit operation, the capacitor bottom node is tied to $V_{DD}$, so there is no voltage drop across the RC delay, therefore eliminating the leakage current through the capacitor. However, during ESD, the capacitor bottom node is then tied to $V_{SS}$, so the circuit works similar to the traditional power-rail ESD protection circuit, which results in the same problems.

Therefore, an alternative to the RC-based ESD detection circuit consists on using a series of forward-connected diodes (diode string) and a resistor, such as shown in FIG. 4. Under a positive-to-$V_{SS}$ ESD stress zapping at $V_{DD}$, the voltage at $V_{DD}$ will start increasing until some voltage when the diodes start conducing. Until then, the node $V_A$ remains 0V. When the diodes start conducing, there will be a voltage drop at the resistor R, which will turn $M_n$ on to trigger the silicon controlled rectifier. The diode string threshold voltage is designed to be higher than the power supply voltage, so under normal circuit operation $V_A$ remains 0V and $M_n$ is turned off. This circuit presents a relatively large leakage current from drain to gate on the transistor $M_n$ due to gate leakage. However, since the silicon controlled rectifier is connected to the source of the transistor, the trigger current will be reduced because of the voltage drop caused on the substrate resistance of the silicon controlled rectifier, which leads the leakage current and the trigger current trade-off.

On account of above, it should be obvious that there is indeed an urgent need for a circuit which that achieves the ease of use of a layout area without aggravating in leakage current inherent when using a power-rail ESD clamp.

SUMMARY OF THE INVENTION

In order to overcome the above-mentioned disadvantages, an approach in accordance with the present invention is provided for a power-rail ESD clamp circuit that is able to reduce the leakage current and the area for implementation.

In one aspect, the power-rail ESD clamp circuit of the present invention comprises a silicon controlled rectifier and a control module. The silicon controlled rectifier is connected to a high voltage level $V_{DD}$ and a low voltage level $V_{SS}$ for bearing a current flow. The control module is connected to the silicon controlled rectifier in parallel, and is connected between the high voltage level $V_{DD}$, the low voltage level $V_{SS}$ and a trigger node of the silicon controlled rectifier.

The silicon controlled rectifier is a P+ triggered silicon controlled rectifier or a N+ triggered silicon controlled rectifier.

In one embodiment, the silicon controlled rectifier is a P+ triggered silicon controlled rectifier, and the control module comprises: a PMOS, connected to the high voltage level $V_{DD}$; a NMOS, connected to the low voltage level $V_{SS}$; at least one output diode, connected between the PMOS and the NMOS, wherein the trigger node of the P+ triggered silicon controlled rectifier is connecting to the at least one output diode, and the PMOS, the NMOS and the at least one output diode are connecting serially together; a resistor, parallelly connected to the P+ triggered silicon controlled rectifier, the PMOS and the NMOS, one end of the resistor connecting to the high voltage level $V_{DD}$; and a conducting string, comprising at least one conducting element connecting to the NMOS, wherein the conducting string is connecting between the other end of the resistor, the PMOS, and the low voltage level $V_{SS}$.

In another embodiment, the silicon controlled rectifier is a N+ triggered silicon controlled rectifier, and the control module comprises: a PMOS, connected to the high voltage level $V_{DD}$; a NMOS, connected to the low voltage level $V_{SS}$; at least one output diode, connected between the PMOS and the NMOS, wherein the trigger node of the N+ triggered silicon controlled rectifier is connecting to the at least one output diode, and the PMOS, the NMOS and the at least one output diode are connecting serially together; a resistor, parallelly connected to the N+ triggered silicon controlled rectifier, the PMOS and the NMOS, one end of the resistor connecting to the low voltage level $V_{SS}$; and a conducting string, comprising at least one conducting element connecting to the PMOS, wherein the conducting string is connecting between the other end of the resistor, the NMOS, and the high voltage level $V_{DD}$.

According to an embodiment of the present invention, the at least one conducting element can be a diode, a NMOS, a PMOS or the like.

These and other objectives of the present invention will become obvious to those of ordinary skill in the art after reading the following detailed description of preferred embodiments.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
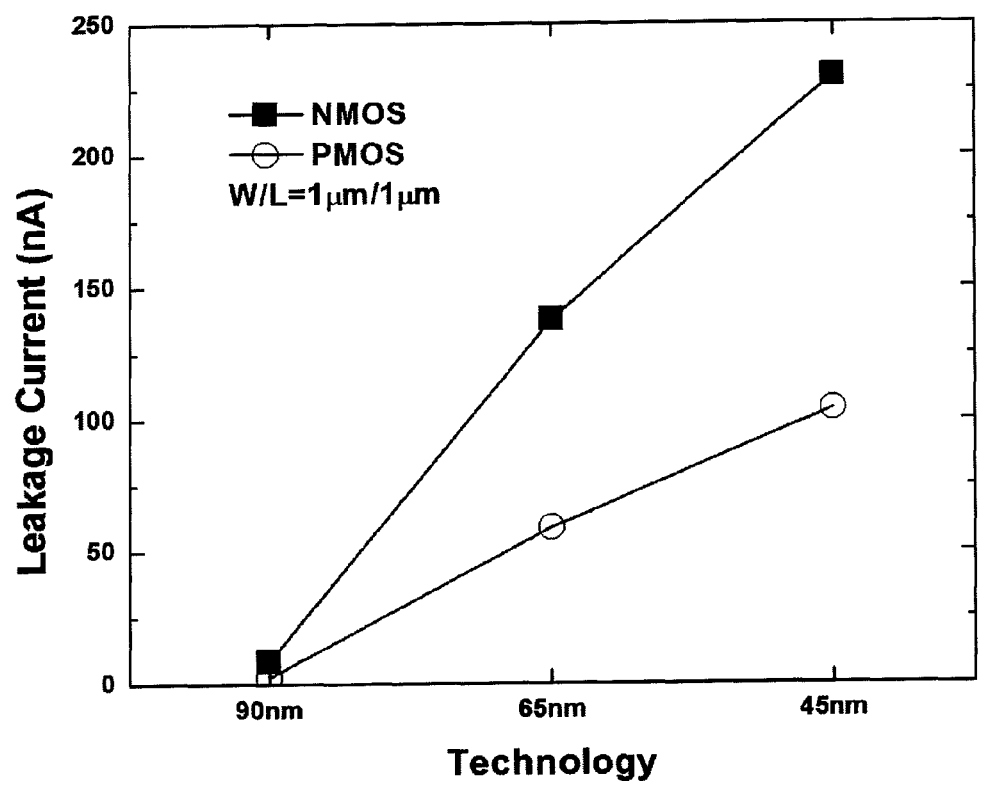
FIG. 1 shows the gate leakage simulation for NMOS and PMOS transistor with size 1 μm/1 μm with 1V-bias and T=25° C.
Figure 2:
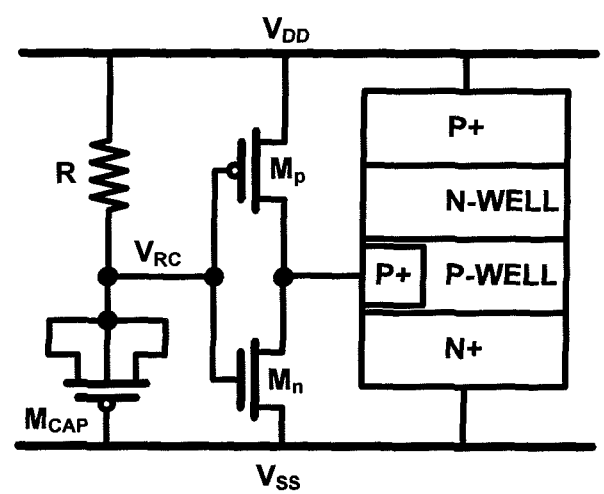
FIG. 2 is a drawing illustrating a traditional power-rail ESD circuit using an SCR as main ESD clamp.
Figure 3:
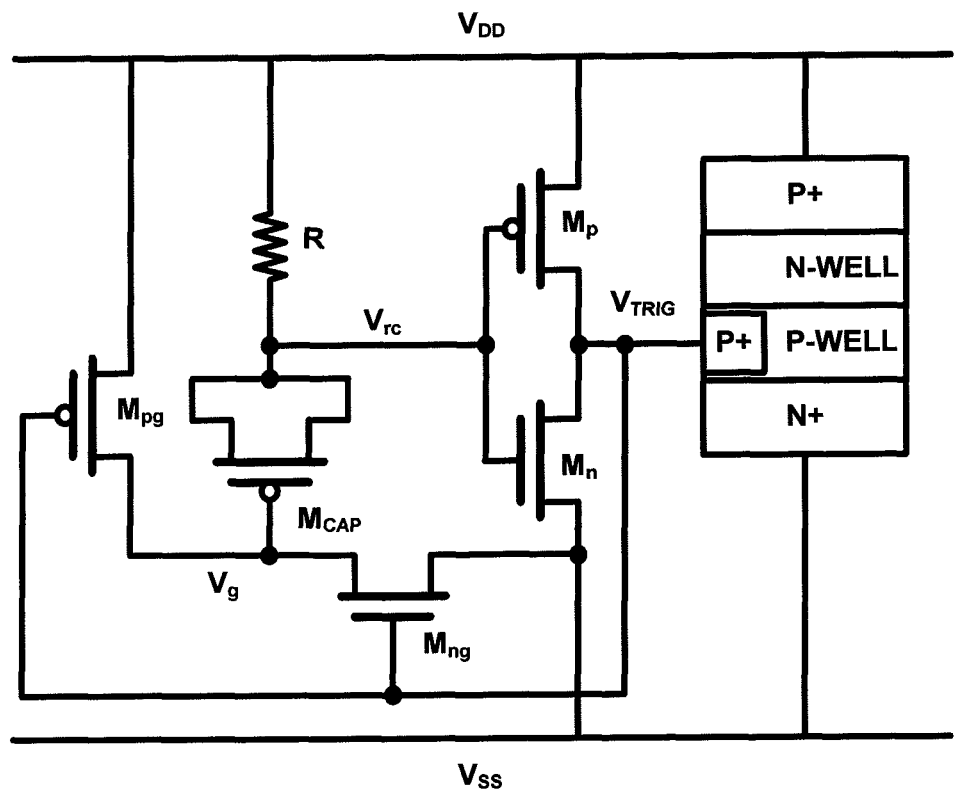
FIG. 3 is a drawing illustrating a traditional power-rail ESD circuit using a series of switches as main ESD clamp.
Figure 4:
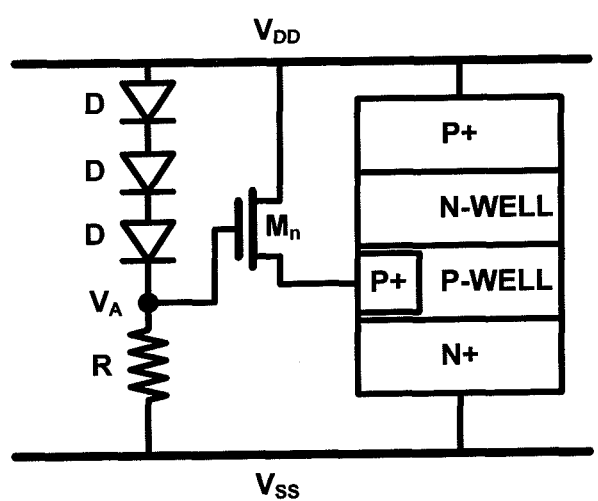
FIG. 4 is a drawing illustrating a traditional power-rail ESD circuit using a series of forward-connected diodes (diode string) and a resistor as main ESD clamp.

Reference will now be made in detail to the preferred embodiments of the present invention, examples of which are illustrated in the accompanying drawings. Wherever possible, the same reference numbers are used in the drawings and the description to refer to the same or like parts.

The embodiments described below are illustrated to demonstrate the technical contents and characteristics of the present invention and to enable the persons skilled in the art to understand, make, and use the present invention. However, it shall be noticed that, it is not intended to limit the scope of the present invention. Therefore, any equivalent modification or variation according to the spirit of the present invention is to be also included within the scope of the present invention.

In order to achieve the purpose of ultra-low standby leakage current and small layout area, the proposed structure of the present invention provides a power-rail ESD clamp circuit, which uses a specific control module to diminish and/or eliminate a current flow flowing through the silicon control rectifier such that ultra-low standby leakage and small layout area can both be successfully accomplished.

The proposed invention does not involve a big capacitor used for the traditional RC ESD-transient detection (as has been done in the past). Therefore, a new type of ESD detection circuit has been designed in the proposed invention in order to successfully reduce the leakage current.

Moreover, the proposed invention lends itself well to minimize its layout area since a big capacitor used in the past is banished from the new power-rail ESD clamp circuit. The proposed invention achieves a circuit area less than 5 μm*20 μm, which is almost one-sixth of the circuit area of the traditional design.

Figure 5:
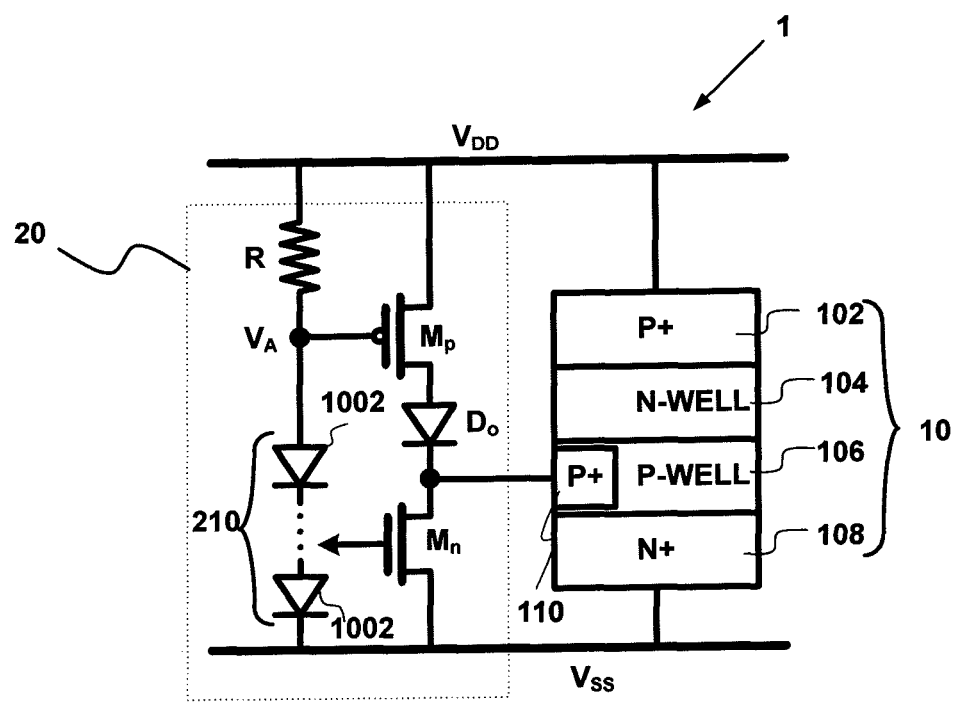
FIG. 5 is a schematic view of a power-rail ESD clamp circuit in accordance with one embodiment of the present invention.

First of all, please refer to FIG. 5, which is a schematic view of a power-rail ESD clamp circuit in accordance with one embodiment of the present invention.

The power-rail ESD clamp circuit 1 of the present invention includes a silicon controlled rectifier (SCR) 10 and a control module 20, wherein the control module 20 is connected to the silicon controlled rectifier 10 in parallel. The silicon controlled rectifier 10 is configured for bearing a current flow, and is connecting to a high voltage level $V_{DD}$ and a low voltage level $V_{SS}$. The control module 20 controls and diminishes the current flow flowing through the silicon controlled rectifier 10, and is connected to the silicon controlled rectifier 10 in parallel between the high voltage level $V_{DD}$ and the low voltage level $V_{SS}$. The control module 20 is connected to a trigger node of the silicon controlled rectifier 10. In one embodiment, the silicon controlled rectifier 10 can be a P+ triggered silicon controlled rectifier in which the trigger node of the P+ triggered silicon controlled rectifier is a P+ region. In other embodiment, the silicon controlled rectifier 10 can also be an N+ triggered silicon controlled rectifier in which the trigger node of the N+ triggered silicon controlled rectifier is a N+ region. The two embodiments of the present invention will be described in detail as following.

Please refer to FIG. 5 in which the silicon controlled rectifier 10 is a P+ triggered silicon controlled rectifier. In this embodiment, the P+ triggered silicon controlled rectifier includes a P/N/P/N structure, wherein a P+ area 102 is connected to the high voltage level $V_{DD}$, a N-well 104 is disposed adjacent to the P+ area 102, a P-well 106 is disposed adjacent to the N-well 104, a P+ region 110 (the trigger node) is disposed in the P-well 106, and a N+ area 108 is disposed adjacent to the P-well 106 and connected to the low voltage level $V_{SS}$.

The control module 20 includes a PMOS $M_p$, a NMOS $M_n$, at least one output diode $D_o$, a resistor R and a conducting string 210. In this embodiment, a source of the PMOS $M_p$ is connecting to the high voltage level $V_{DD}$. A source of the NMOS $M_n$ is connecting to the low voltage level $V_{SS}$. In between a drain of the PMOS $M_p$ and a drain of the NMOS $M_n$ is the output diode $D_o$ such that the PMOS $M_p$, the NMOS $M_n$, and the output diode $D_o$ are connecting serially together and the P+ region 110 (the trigger node) of the P+ triggered silicon controlled rectifier 10 is connecting to the output diode $D_o$.

One end of the resistor R is connecting to the high voltage level $V_{DD}$, and the resistor R is parallelly connected to the P+ triggered silicon controlled rectifier 10, the PMOS $M_p$, the NMOS $M_n$, and the output diode $D_o$.

The conducting string 210 comprises at least one conducting element, wherein one end of the conducting string 210 is connecting to the resistor R and a gate of the PMOS $M_p$ while the other end of the conducting string 210 is connecting to the low voltage level $V_{SS}$. A gate of the NMOS $M_n$ is connecting to the at least one conducting element.

In this embodiment, the at least one conducting element is a diode 1002. The conducting string 210 can be composed of one or a plurality of diodes 1002. The number of diodes 1002 in the string is determined according to the desired threshold voltage. In one embodiment, the number of diodes is process dependent.

In general, the PMOS transistor $M_p$ is used to trigger the silicon controlled rectifier 10. The NMOS transistor $M_n$ is used to maintain the silicon controlled rectifier trigger node to $V_{SS}$ under normal circuit operation. The gate of this transistor can be connected either to $V_A$ or to an internal node of the diode string to reduce the gate leakage on this transistor.

Figure 6:
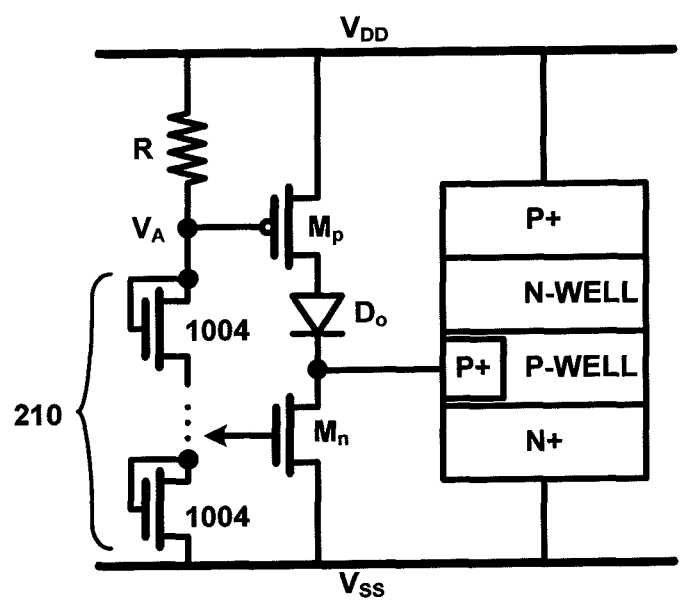
FIG. 6 is a drawing illustrating an embodiment of the power-rail ESD clamp circuit using diode-connected NMOS transistors.
Figure 7:
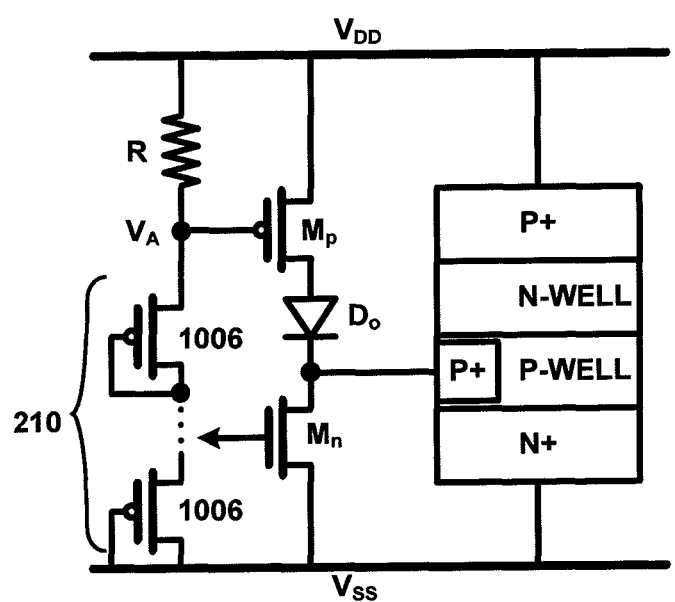
FIG. 7 is a drawing illustrating another embodiment of the power-rail ESD clamp circuit using diode-connected PMOS transistors.

The diodes composing the diode string can be implanted using P+/NW structures, diode-connected transistors, or any other diode structure available. For example, FIG. 6 shows an embodiment of the power-rail ESD clamp circuit using diode-connected NMOS transistors. FIG. 7 shows another embodiment of the power-rail ESD clamp circuit using diode-connected PMOS transistors. As referring to FIG. 6 and FIG. 7, it can be obviously seen that the conducting element composing the conducting string 210 of the present invention can be a NMOS transistor 1004 or a PMOS transistor 1006, besides the diode 1002. Certainly, other simple combinations of serially-connected diodes or transistors can also be implemented so that the diode string is composed. The proposed invention is fully described abovementioned but not limited thereto.

Figure 8:
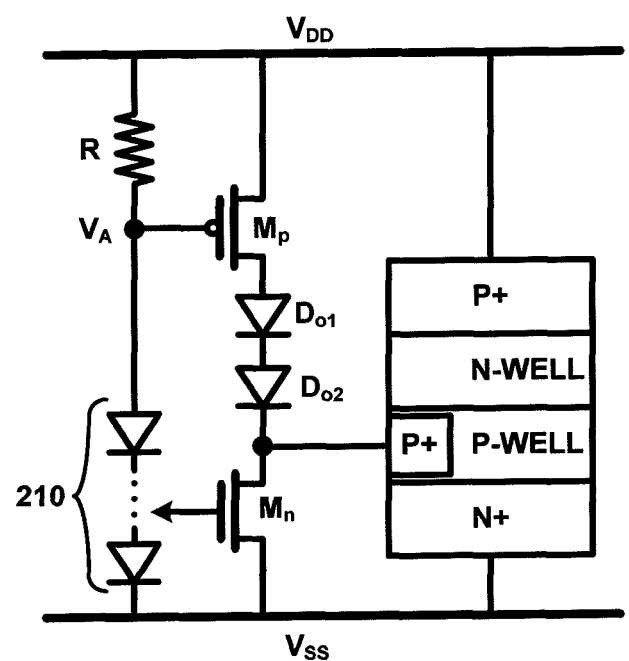
FIG. 8 is a drawing illustrating an embodiment of the power-rail ESD clamp circuit using more than one output diode.
Figure 9:
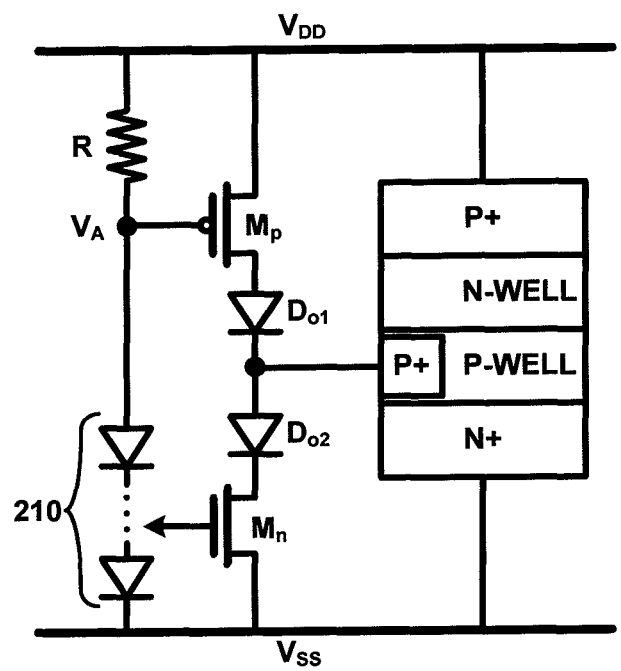
FIG. 9 is a drawing illustrating an embodiment of the power-rail ESD clamp circuit using more than one output diode.

Moreover, please refer to FIG. 8 and FIG. 9, which shows an embodiment of the power-rail ESD clamp circuit using more than one output diode, relatively.

In the embodiments of FIG. 8 and FIG. 9, the present invention uses more than one output diode $D_o$ disposed between the PMOS $M_p$ and the NMOS $M_n$.

As shown in FIG. 5, the output diode $D_o$ is placed between the PMOS $M_p$ and the NMOS $M_n$ to reduce the gate-drain leakage current of the PMOS $M_p$ under normal circuit operation. However, if desired, as shown in FIG. 8 and FIG. 9, more than one output diodes $Do_1$, $Do_2$ can also be placed between the PMOS $M_p$ and the NMOS $M_n$ in order to further reduce the leakage current of the power-rail ESD clamp circuit of the present invention.

Under normal circuit operation, the high voltage level $V_{DD}$ remains at the supply voltage. The diode string threshold voltage is designed to be higher than the supply voltage, so there is no current through the diode string and therefore the PMOS $M_p$ is turned off and the NMOS $M_n$ is turned on. Therefore, there is a leakage current from the gate to the drain of the PMOS $M_p$ due to the gate leakage issue. This leakage current causes a voltage drop across the output diode $D_o$, which reduced the gate-drain voltage of the PMOS $M_p$, which in turns reduces the leakage current through the PMOS $M_p$. As the gate leakage current depends exponentially with the voltage, the small voltage drop across the output diode $D_o$ drastically reduces the current through the PMOS $M_p$.

Under positive ESD stress, when the voltage at the high voltage level $V_{DD}$ reaches the diode string threshold voltage, the diode string starts conducting current, and therefore there is a voltage drop across the resistor R, which turns the PMOS $M_p$ on to trigger the silicon controlled rectifier 10. The output diode $D_o$ will cause the trigger current of the silicon controlled rectifier 10 to be slightly smaller than if no output diode $D_o$ were placed, however it shall be noticed that this reduction does not cause any noticeable effect on the ESD performance of the power-rail ESD clamp circuit of the present invention.

Figure 10:
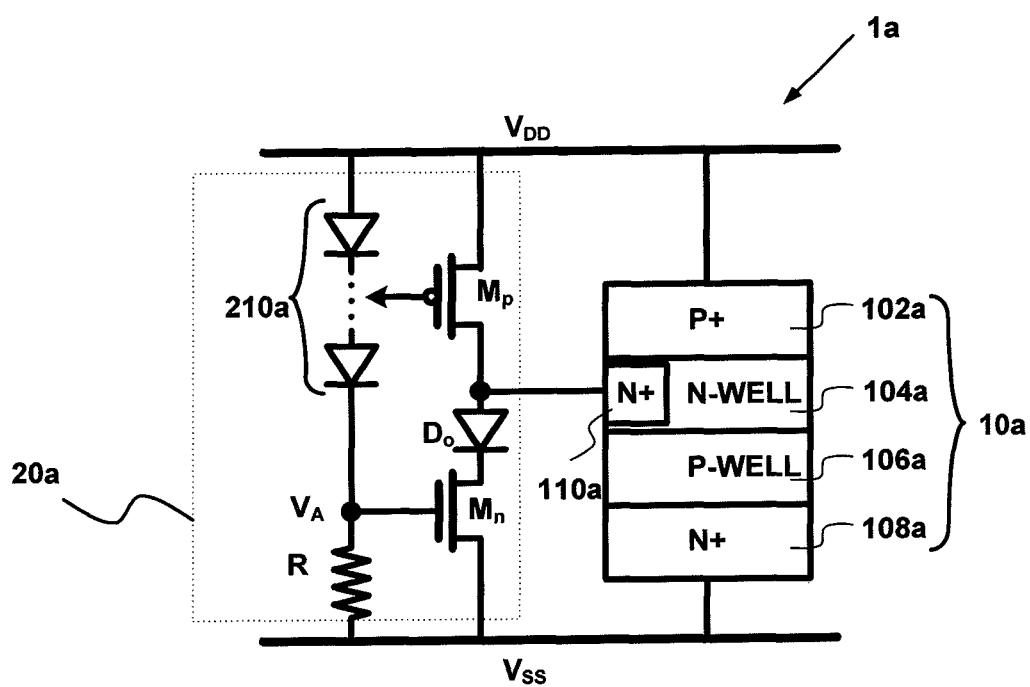
FIG. 10 is a schematic view of a power-rail ESD clamp circuit in accordance with another embodiment of the present invention.

Apart from above, another embodiment of the proposed invention considers the use of an N+ triggered silicon controlled rectifier. This embodiment is shown in FIG. 10, which is a schematic view of a power-rail ESD clamp circuit in accordance with another embodiment of the present invention. In this embodiment, the conducting string and the resistor R of the power-rail ESD clamp circuit 1a are inverted to turn the NMOS $M_n$ on under ESD stress instead of the PMOS $M_p$. The output diode $D_o$ of the power-rail ESD clamp circuit 1a is placed between the silicon controlled rectifier trigger point and the NMOS $M_n$ to reduce the leakage current.

In this embodiment, as shown in FIG. 10, the silicon controlled rectifier 10a is a N+ triggered silicon controlled rectifier and includes a P/N/P/N structure, wherein a P+ area 102a is connected to the high voltage level $V_{DD}$, a N-well 104a is disposed adjacent to the P+ area 102a, a P-well 106a is disposed adjacent to the N-well 104a, a N+ region 110a (the trigger node of the N+ triggered silicon controlled rectifier 10a) is disposed in the N-well 104a, and a N+ area 108a is disposed adjacent to the P-well 106a and connected to the low voltage level $V_{SS}$.

As such, the control module 20a includes a PMOS $M_p$, a NMOS $M_n$, at least one output diode $D_o$, a resistor R and a conducting string 210a. In this embodiment of the silicon controlled rectifier 10a being a N+ triggered silicon controlled rectifier, a source of the PMOS $M_p$ is connecting to the high voltage level $V_{DD}$ and a source of the NMOS $M_n$ is connecting to the low voltage level $V_{SS}$. In between a drain of the PMOS $M_p$ and a drain of the NMOS $M_n$ is the output diode $D_o$ such that the PMOS $M_p$, the NMOS $M_n$, and the output diode $D_o$ are connecting serially together and the N+ region 110a (the trigger node) of the N+ triggered silicon controlled rectifier 10a is connecting to the output diode $D_o$.

One end of the resistor R is connecting to the low voltage level $V_{SS}$, and the resistor R is connected in parallel to the N+ triggered silicon controlled rectifier 10a, the PMOS $M_p$, the NMOS $M_n$, and the output diode $D_o$.

The conducting string 210a comprises at least one conducting element, wherein one end of the conducting string 210a is connecting to the resistor R and a gate of the NMOS $M_n$ while the other end of the conducting string 210a is connecting to the high voltage level $V_{DD}$. A gate of the PMOS $M_p$ is connecting to the at least one conducting element.

In this embodiment, the at least one conducting element is a diode 1002a. Similar to the foregoing techniques, the conducting string 210a can be composed of one or a plurality of diodes 1002a. The number of diodes 1002a in the string is determined according to the desired threshold voltage. In one embodiment, the number of diodes is process dependent.

Furthermore, the diodes composing the diode string can also be implanted using P+/NW structures, diode-connected transistors, or any other diode structure available as previously described in FIG. 6 and FIG. 7. As such, the conducting element composing the conducting string 210a of the present invention can also be a NMOS transistor or a PMOS transistor, besides the diode 1002a. Undoubtedly, other simple combinations of serially-connected diodes or transistors can also be implemented so that the diode string is composed. The proposed invention is fully described abovementioned but not limited thereto.

Figure 11A:
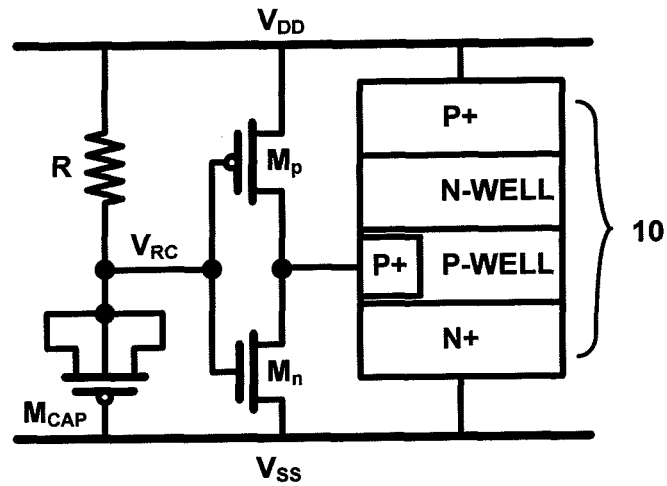
FIG. 11A is a schematic view showing an implemented circuit for silicon verification of a traditional power-rail ESD clamp circuit.
Figure 11B:
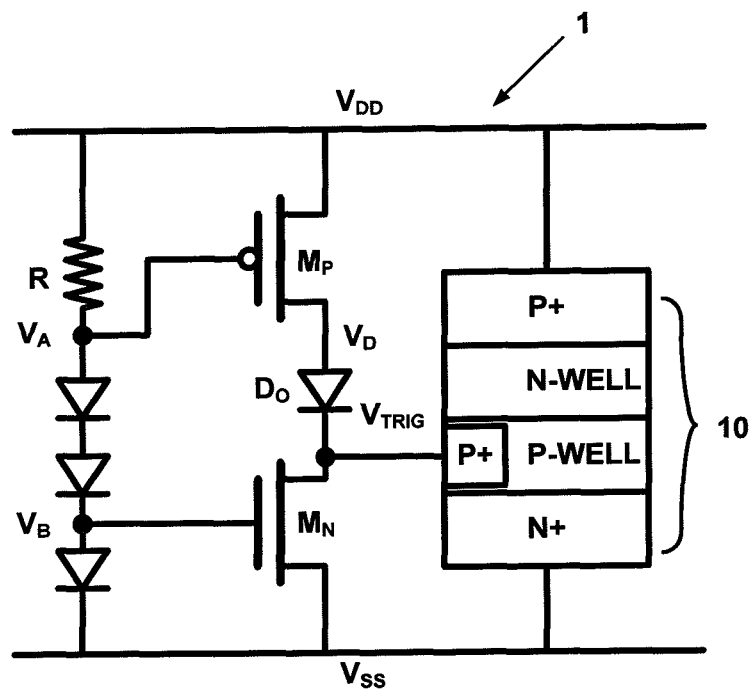
FIG. 11B is a schematic view showing an implemented circuit for silicon verification of a power-rail ESD clamp circuit in accordance with one embodiment of the present invention.

Here, please refer to FIG. 11A and FIG. 11B for comparing the present invention to the traditional power-rail ESD clamp circuit. The present invention was implemented and verified in a 40-nm CMOS process. The traditional power-rail ESD clamp circuit was also implemented for comparison. The two implemented circuits are shown in FIG. 11A and FIG. 11B. FIG. 11A shows an implemented circuit for silicon verification of a traditional power-rail ESD clamp circuit, and FIG. 11B shows an implemented circuit for silicon verification of a power-rail ESD clamp circuit in accordance with one embodiment of the present invention.

The device sizes are presented in below Table I. Both circuits were design with the same silicon controlled rectifier device. The width of the silicon controlled rectifier is 40 μm. The diode string of the present invention is implemented with 3 diodes to obtain a threshold voltage of approximate 2.5V, which is higher than the core supply voltage (0.9V). The gate of the NMOS $M_n$ is connected to $V_B$. Under normal circuit operation, $V_A$ is close to $V_{DD}$ and $V_B$ is about $V_{DD}/3$. The voltage of $V_B$ is high enough to keep the NMOS $M_n$ turned on, and the leakage current through this transistor results smaller than if tied to $V_A$.

TABLE I

Device Sizes used in the Chip Verification.

|  | Traditional Design (FIG. 11A) | Proposed Design (FIG. 11B) |
| --- | --- | --- |
| $M_p$ | 100 μm/0.1 μm | 100 μm/0.1 μm |
| $M_n$ | 1 μm/0.1 μm | 1 μm/0.1 μm |
| R | 50 kΩ | 5 kΩ |
| $M_{CAP}$ | 10 μm/10 μm |  |
| D |  | 1 μm × 1 μm |
| $D_o$ |  | 20 μm × 1 μm |
| SCR Area | 47 μm × 7 μm | 47 μm × 7 μm |
| Circuit Area | 30 μm × 30 μm | 5 μm × 20 μm |

Figure 12:
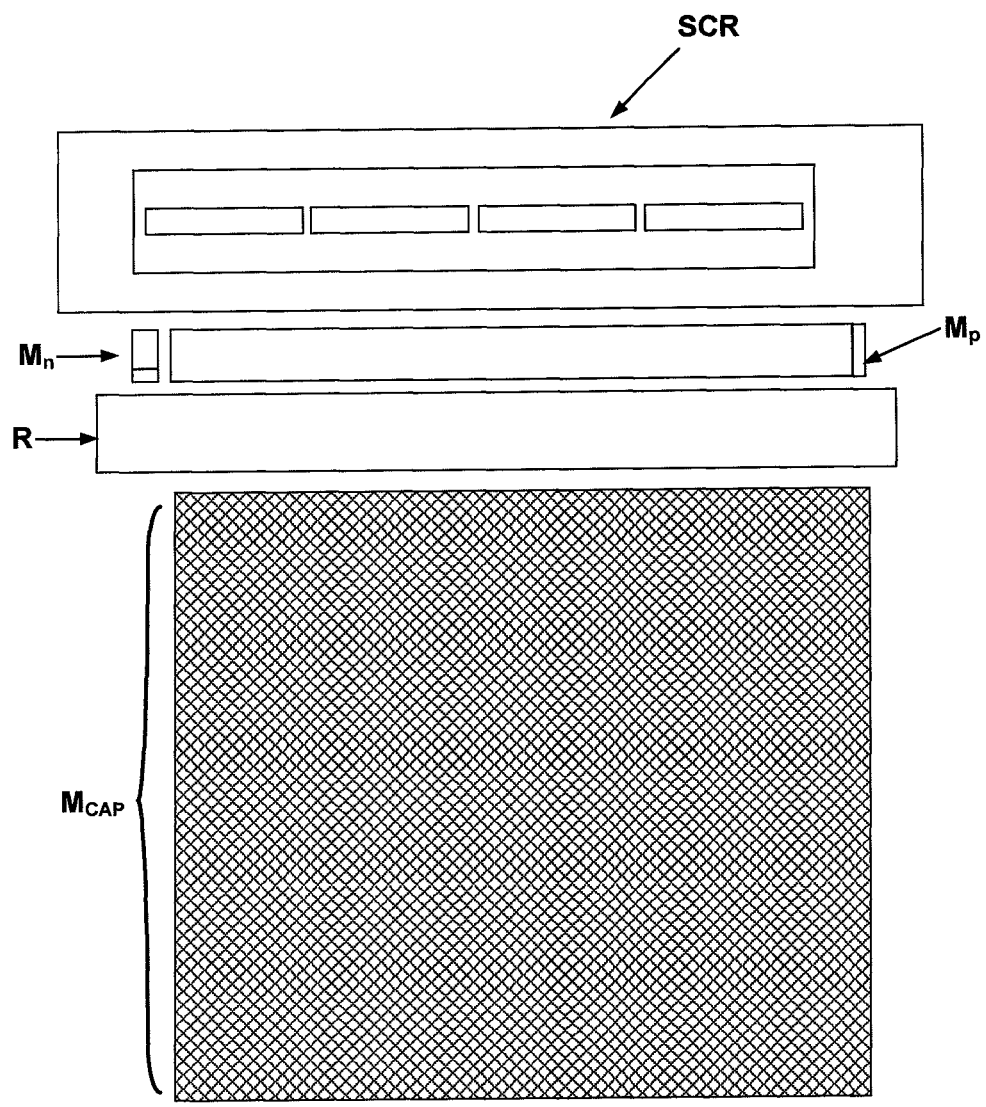
FIG. 12 is a layout top view of the traditional power-rail ESD clamp circuit in FIG. 11A.
Figure 13:
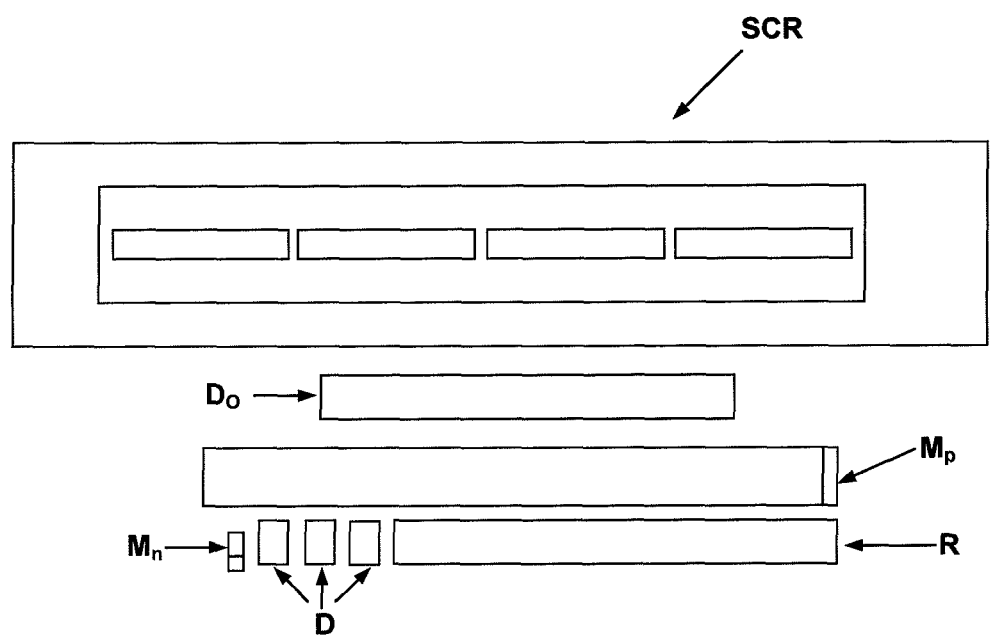
FIG. 13 is a layout top view of the power-rail ESD clamp circuit in accordance with one embodiment of the present invention in FIG. 11B.

The layouts for the traditional and the present invention are shown in FIG. 12 and FIG. 13, respectively. FIG. 12 is a layout top view of the traditional power-rail ESD clamp circuit in FIG. 11A. FIG. 13 is a layout top view of the power-rail ESD clamp circuit in accordance with one embodiment of the present invention in FIG. 11B.

As shown in Table I, FIG. 12 and FIG. 13, the traditional power rail ESD clamp circuit requires an area of 30 μm×30 μm (without considering the silicon controlled rectifier, SCR area), mainly due to the capacitor ($M_{CAP}$), which requires an area of 25 μm×25 μm (even though the effective area is 10 μm×10 μm, it cannot be implemented as a single transistor due to a process limitation, so it is divided into 100 transistors of 1 μm×1 μm). Nevertheless, the power-rail ESD clamp circuit of the present invention proposed design requires only an area of 5 μm×20 μm (without considering the SCR area), which is only approximately one-sixth of the circuit area of the traditional design.

Also, results of the measurements are presented in Table II. The leakage current was measured with a voltage bias of 0.9V, at controlled temperatures of 25° C. and 125° C., relatively. As seen in Table II, the traditional power-rail ESD clamp circuit presents a very large leakage current (5.12 μA at 25° C.) due to the gate tunneling issue. However, the present invention achieves a much smaller leakage, being only 24 nA at 25° C. The ESD levels were measured using both the Human Body Model (HBM) and Machine Model (MM). As shown in Table II, the traditional power-rail ESD clamp circuit can withstand 4.5 kV HBM and 125V MM. The present invention shows a better ESD performance, with 6.5 kV HBM and 200V MM.

TABLE II

Measurement Results in the Silicon Chip (fabricated in 40-nm CMOS Process)

| Design | $M_p$ width | HBM | MM | Leakage Current T = 25° C. | Leakage Current T = 125° C. |
| --- | --- | --- | --- | --- | --- |
| Traditional Design (FIG. 11a) | 100 μm | 4.5 kV | 125 V | 5.12 μA | 26 μA |
| Proposed Design (FIG. 11b) | 100 μm | 6.5 kV | 200 V | 24 nA | 328 nA |

As a result, to sum up, a novel power-rail ESD clamp circuit has been provided in the present invention to reduce both the leakage current and area for implementation. By using a diode string ESD detection circuit, the leakage issue in the ESD detection circuit is eliminated. Moreover, the required area for implementation is much smaller than the one of the conventional RC ESD detection circuit. The output diode reduced the leakage current present in the SCR trigger transistor without negative impact on the ESD performance.

It will be apparent to those skilled in the art that various modifications and variations can be made to the present invention without departing from the scope or spirit of the invention. In view of the foregoing, it is intended that the present invention cover modifications and variations of this invention provided they fall within the scope of the invention and its equivalent.

What is claimed is:

1. A power-rail Electro-Static Discharge (ESD) clamp circuit comprising:
   a silicon controlled rectifier, connected to a high voltage level $V_{DD}$ and a low voltage level $V_{SS}$ for bearing a current flow; and
   a control module, connected to said silicon controlled rectifier in parallel, said control module connecting between said high voltage level $V_{DD}$, said low voltage level $V_{SS}$ and a trigger node of said silicon controlled rectifier, wherein said silicon controlled rectifier is a P+ triggered silicon controlled rectifier, and said control module comprises:
   a PMOS, connected to said high voltage level $V_{DD}$;
   an NMOS, connected to said low voltage level $V_{SS}$;
   at least one output diode, connected between said PMOS and said NMOS, wherein said trigger node of said P+ triggered silicon controlled rectifier is connecting to said at least one output diode, and said PMOS, said NMOS and said at least one output diode are connecting serially together;
   a resistor, parallel connected to said P+ triggered silicon controlled rectifier, said PMOS and said NMOS, one end of said resistor connecting to said high voltage level $V_{DD}$; and
   a conducting string, comprising at least one conducting element connected to said NMOS, wherein said conducting string is connecting between the other end of said resistor, said PMOS, and said low voltage level $V_{SS}$.

2. The power-rail ESD clamp circuit of claim 1, wherein said at least one conducting element is a diode.

3. The power-rail ESD clamp circuit of claim 1, wherein said at least one conducting element is a PMOS.

4. The power-rail ESD clamp circuit of claim 1, wherein said at least one conducting element is an NMOS.

5. The power-rail ESD clamp circuit of claim 1, wherein said P+ triggered silicon controlled rectifier comprises:
   a P+ area, connected to said high voltage level $V_{DD}$;
   a N-well, disposed adjacent to said P+ area;
   a P-well, disposed adjacent to said N-well, said trigger node of said P+ triggered silicon controlled rectifier disposed in said P-well; and
   a N+ area, disposed adjacent to said P-well and connected to said low voltage level $V_{SS}$.

6. The power-rail ESD clamp circuit of claim 5, wherein said trigger node of said P+ triggered silicon controlled rectifier is a P+ region.

7. A power-rail Electro-Static Discharge (ESD) clamp circuit comprising:
   a silicon controlled rectifier, connected to a high voltage level $V_{DD}$ and a low voltage level $V_{SS}$ for bearing a current flow; and
   a control module, connected to said silicon controlled rectifier in parallel, said control module connecting between said high voltage level $V_{DD}$, said low voltage level $V_{SS}$ and a trigger node of said silicon controlled rectifier, wherein said silicon controlled rectifier is a N+ triggered silicon controlled rectifier, and said control module comprises:
   a PMOS, connected to said high voltage level $V_{DD}$;
   an NMOS, connected to said low voltage level $V_{SS}$;
   at least one output diode, connected between said PMOS and said NMOS, wherein said trigger node of said N+ triggered silicon controlled rectifier is connecting to said at least one output diode, and said PMOS, said NMOS and said at least one output diode are connecting serially together;
   a resistor, connected in parallel to said N+ triggered silicon controlled rectifier, said PMOS and said NMOS, one end of said resistor connecting to said low voltage level Vss; and
   a conducting string, comprising at least one conducting element connecting to said PMOS, wherein said conducting string is connecting between the other end of said resistor, said NMOS, and said high voltage level $V_{DD}$.

8. The power-rail ESD clamp circuit of claim 7, wherein said at least one conducting element is a diode.

9. The power-rail ESD clamp circuit of claim 7, wherein said at least one conducting element is a PMOS.

10. The power-rail ESD clamp circuit of claim 7, wherein said at least one conducting element is an NMOS.

11. The power-rail ESD clamp circuit of claim 7, wherein said N+ triggered silicon controlled rectifier comprises:
    a P+ area, connected to said high voltage level $V_{DD}$;
    a N-well, disposed adjacent to said P+ area, said trigger node of said N+ triggered silicon controlled rectifier disposed in said N-well;
    a P-well, disposed adjacent to said N-well; and
    a N+ area, disposed adjacent to said P-well and connected to said low voltage level $V_{SS}$.

12. The power-rail ESD clamp circuit of claim 11, wherein said trigger node of said N+ triggered silicon controlled rectifier is a N+ region.

* * * * *